United States Patent
Liao et al.

(10) Patent No.: US 10,775,706 B2
(45) Date of Patent: Sep. 15, 2020

(54) LITHOGRAPHY APPARATUS AND METHOD USING THE SAME

(71) Applicant: TAIWAN SEMICONDUCTOR MANUFACTURING CO., LTD., Hsinchu (TW)

(72) Inventors: Chi-Hung Liao, New Taipei (TW); Min-Cheng Wu, Taitung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/143,715

(22) Filed: Sep. 27, 2018

(65) Prior Publication Data

US 2020/0103765 A1    Apr. 2, 2020

(51) Int. Cl.
*G03F 7/20* (2006.01)
*G02B 27/09* (2006.01)
*G02F 1/1343* (2006.01)

(52) U.S. Cl.
CPC ..... *G03F 7/70641* (2013.01); *G02B 27/0955* (2013.01); *G02F 1/1343* (2013.01); *G03F 7/2004* (2013.01); *G03F 7/70275* (2013.01)

(58) Field of Classification Search
CPC ............. G03F 7/70258; G03F 7/70641; G03F 7/70275

USPC ......................................... 355/52, 53, 55, 67
See application file for complete search history.

(56) References Cited

U.S. PATENT DOCUMENTS

| 5,777,722 A * | 7/1998 | Miyazaki ............ G03F 7/70275 355/53 |
| 2006/0158619 A1* | 7/2006 | Hall, Jr. ............... H04N 5/7441 353/99 |
| 2009/0103068 A1* | 4/2009 | Yu ....................... G03F 7/70258 355/56 |

* cited by examiner

*Primary Examiner* — Hung Nguyen
(74) *Attorney, Agent, or Firm* — McClure, Qualey & Rodack, LLP (57) ABSTRACT

A method of lithography includes obtaining a profile of a single field of a substrate that having a photoresist layer thereon, in which the profile includes a first feature and a second feature having different heights. A depth of focus distribution map is generated according to the profile. A project lens is tuned based on the generated depth of focus distribution map, such that the project lens provides a first focus length in a first project pixel of the project lens and a second focus length in a second project pixel of the project lens, wherein the first focus length and the second focus lengths. The single field of the substrate is exposed by using the tuned project lens.

20 Claims, 12 Drawing Sheets

LITHOGRAPHY APPARATUS AND METHOD USING THE SAME

BACKGROUND

A scanner, also known as a step-and-scan system, is a type of exposure tool used in modern-day lithography processes to fabricate semiconductor devices. A scanner provides for moving a substrate (e.g., a wafer) and reticle (commonly referred to as a "mask") with respect to one another while exposing photosensitive material present on the substrate. Conventional scanners, as well as other conventional exposure tools, are limited in that the exposure process is executed at a fixed focus length for a given exposure field. An exposure field includes an area of a substrate covered (e.g., exposed) by a single exposure or "shot." In contrast to this, today's semiconductor devices often include dramatic pattern density differences providing for great variations in feature height above the plane of the substrate. For example, a dual damascene process, a typical method of forming interconnects in a semiconductor device, provides a large step height difference that can result in a large intra-exposure field focus range. This intra-field focus range negatively impacts the depth-of-focus (DOF). A poor DOF provides for decreased resolution in the lithography process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
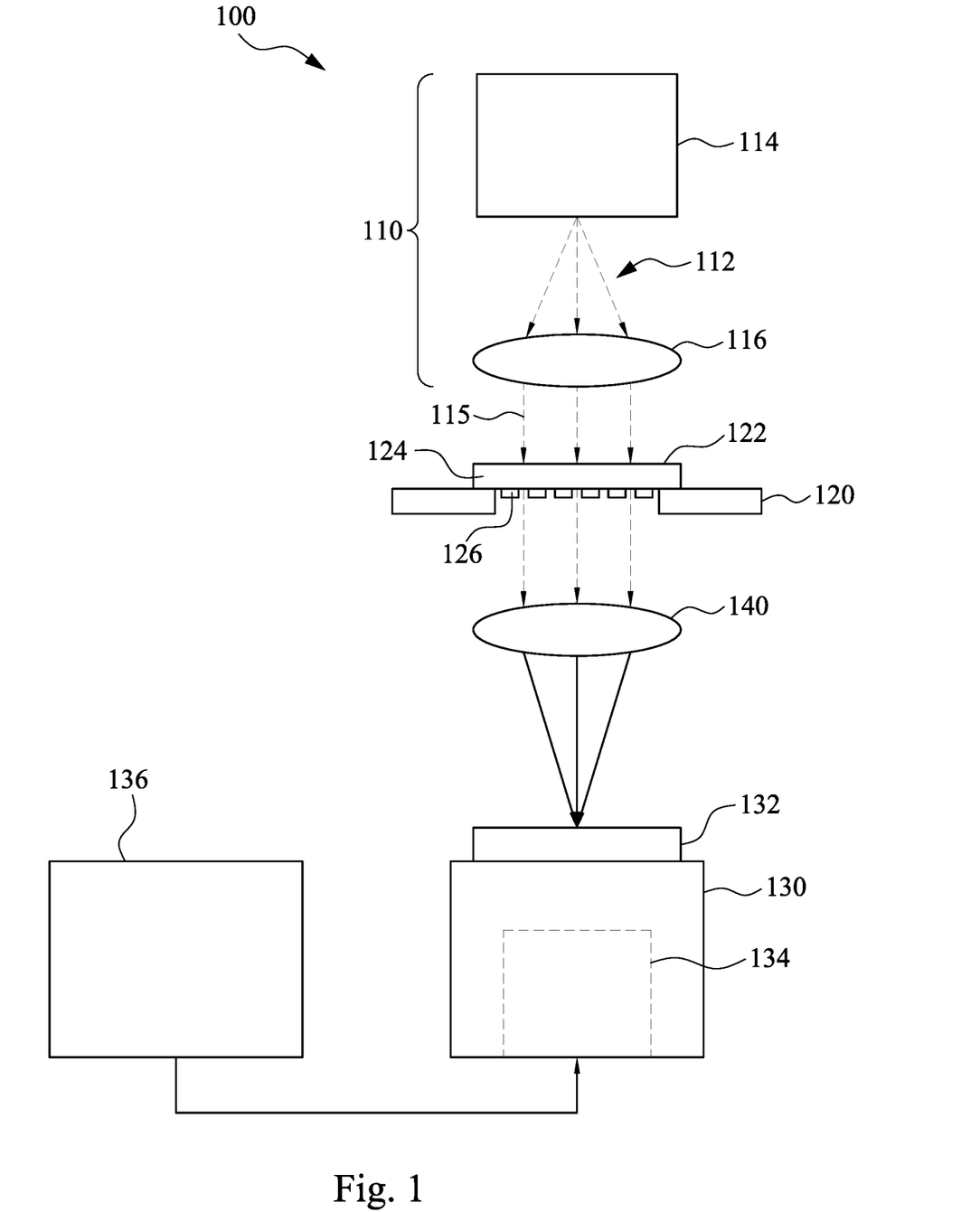
FIG. 1 is a schematic side view of a lithography apparatus according to some embodiments of the disclosure.

FIG. 1 is a schematic side view of a lithography apparatus according to some embodiments of the disclosure, in which the lithography apparatus is utilized for the exposure of semiconductor wafers. The lithography apparatus 100 includes a light source 110 that produces a beam of radiation 112, a reticle stage 120 that is capable of supporting a reticle 122, a wafer stage 130 that is capable of supporting a wafer 132, and a projection lens 140 that is disposed between the reticle 122 and the wafer 132.

The light source 110 provides aligned beam of radiation 112 to the reticle 122. The light source 110 includes a radiation generator 114 and one or more optical components 116 disposed between the radiation generator 114 and the reticle 122. In some embodiments, the radiation generator 114 is a mercury lamp having a wavelength of about 436 nm (G-line) or about 365 nm (I-line), a Krypton Fluoride (KrF) excimer laser with wavelength of about 248 nm, an Argon Fluoride (ArF) excimer laser with a wavelength of about 193 nm, a Fluoride ($F_2$) excimer laser with a wavelength of about 157 nm, or other light source having a desired wavelength (e.g., below approximately 100 nm). In some other embodiments, the radiation generator 114 can be an excimer laser capable of producing light in a deep ultraviolet (DUV) range with a spectral width of approximately 0.3 picometers (pm). Alternatively, the radiation generator 114 may produce a beam of radiation 112 in other ranges such as vacuum ultraviolet (VUV) or extreme ultraviolet (EUV).

It should be understood that in the above description of light sources, each light source may have a certain wavelength distribution, or line width, rather than an exact single wavelength. For example, the I-line (e.g., 365 nm) wavelength of the mercury lamp may not be exactly 365 nm, but may be centered at approximately 365 nm with a range of varying wavelengths extending above and below 365 nm. This range may be used to determine a minimum possible line width during lithography, with less variation from the desired 365 nm wavelength resulting in a thinner line width. Additionally, the beam's spectral width may alternatively be larger or smaller depending on the exposure application. Here, spectral width is defined as the spectral distance between the two wavelengths that encompass ninety-five percent of spectral energy of the beam. This method of measuring spectral width is commonly known as E95.

In some embodiments, the optical component 116 may include microlens arrays, shadow masks, and/or other structures designed to aid in directing light from the radiation generator 114 onto the reticle 122. In some embodiments, the optical component 116 includes standard condenser lens, and the beam of radiation 112 is directed along an optical axis 115 after passing through the optical component 116. The condenser lens in the optical component 116 is configured to collimate and direct the beam of radiation 112 along the optical axis 115 toward the reticle 122.

The reticle 122 is held by the reticle stage 120 at a location along the optical axis 115 and includes a pattern image to be transferred along the optical axis. The reticle stage 120 is configured to adjust the position of the reticle 122 in directions transverse to the optical axis 115 for stepping between exposure fields on the wafer 132 and for aligning the reticle 122 with the optical axis. In some embodiment, the reticle 122 is also referred as a mask or a photomask. The reticle 122 includes a transparent substrate 124 and patterned absorption regions 126 disposed on the transparent substrate 124. In some embodiments, the patterned absorption regions 126 are disposed at a bottom surface of the transparent substrate 124. That is, the patterned absorption regions 126 are disposed on the surface facing the project lens 140 of the transparent substrate 124. The beam 112 is partially or completely blocked when hitting the absorption regions 126.

After passing through the reticle 122, the portion of the beam 112 unblocked by the absorption regions 126 passes through the project lens 140. The project lens 140 is configured to focus the pattern image carried by the beam 112 to the predetermined position on the wafer 132 along the optical axis. Both condenser lens in the optical component 116 and projection lens 140 are exemplary and alternatively may each be a lens group.

The wafer 132, such as a semiconductor wafer is disposed along the optical axis 115 below the project lens 140. The wafer 132 includes a plurality of exposure fields that may be successively aligned with the reticle 122 so that the beam 112 individually exposes each exposure field with the pattern contained on the reticle 122. The wafer stage 130 supports the wafer 132 and is configured to movably position it for proper alignment along the optical axis or relative to the project lens 140 between stepping. For example, the wafer 132 is moved with respect to the reticle 122 by the wafer stage 130 while exposing photosensitive material present on the wafer 132. In some embodiments, the wafer stage 130 can be adjusted in three orthogonal directions, x, y, and z, where z is parallel to the optical axis 115, and x and y lie in a plane substantially perpendicular to the optical axis 115. A wafer stage drive 134 is included in the wafer stage 130 and contains hardware to make the adjustments to the position of the wafer stage 130. A wafer stage control 136 is electronically coupled to the wafer stage drive 136 and is configured to transmit control data for controlling the position of the wafer stage 130 and thus the wafer 132. The wafer stage drive 134 includes a not-illustrated digital processor, and a memory storing a computer program executed by the processor, but could alternatively be implemented in some other manner.

Prior to the exposure process step, the wafer 132 may go through various other fabrication processes including forming a layer of photosensitive material on the wafer 132. The photosensitive material typically includes a layer of photoresist on the substrate. The forming of a photoresist layer on the substrate may be performed by a spin-on process, a deposition process, and/or other process for forming a layer known in the art. After forming the photoresist layer, the wafer 132 may be soft baked to evaporate solvents. The wafer 132 may then be transferred to the lithography apparatus 100 and in particular, to the wafer stage 130. After exposure, the wafer 132 may be subjected to further lithography processing such as, a post exposure bake providing for polymer dissolution and subsequent development of the exposed pattern. The pattern may be used to form one or more features on the substrate such as, a gate feature, a source feature, a drain feature, an interconnect feature, an isolation feature, and/or other integrated circuit features known in the art. Such features may be formed using conventional fabrication method such as, ion implantation, diffusion, deposition, plating, etching, chemical mechanical polish, oxidation and/or other processes known in the art.

However, with the increasing of the functional density, e.g. the number of interconnected devices per chip area, each of the fields on the wafer 132 may include dramatic pattern density differences providing for great variations in feature height above the plane of the substrate and that can result in a large intra-exposure field focus range. This intra-field focus range negatively impacts the depth-of-focus (DOF). A poor DOF would decrease resolution in the lithography process.

Figure 2A:
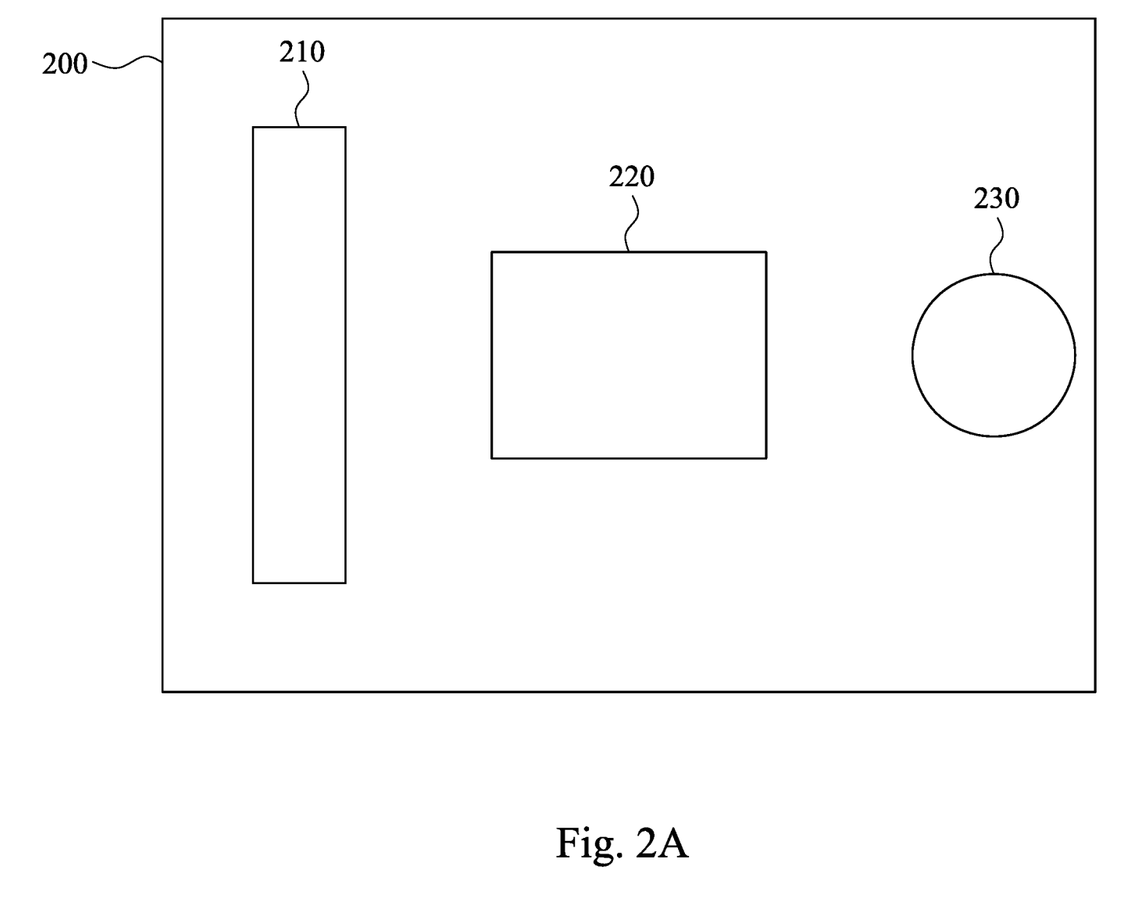
FIGS. 2A and 2B are schematic side view and top view of different patterns of a field on the wafer of some embodiments of the disclosure.
Figure 2B:
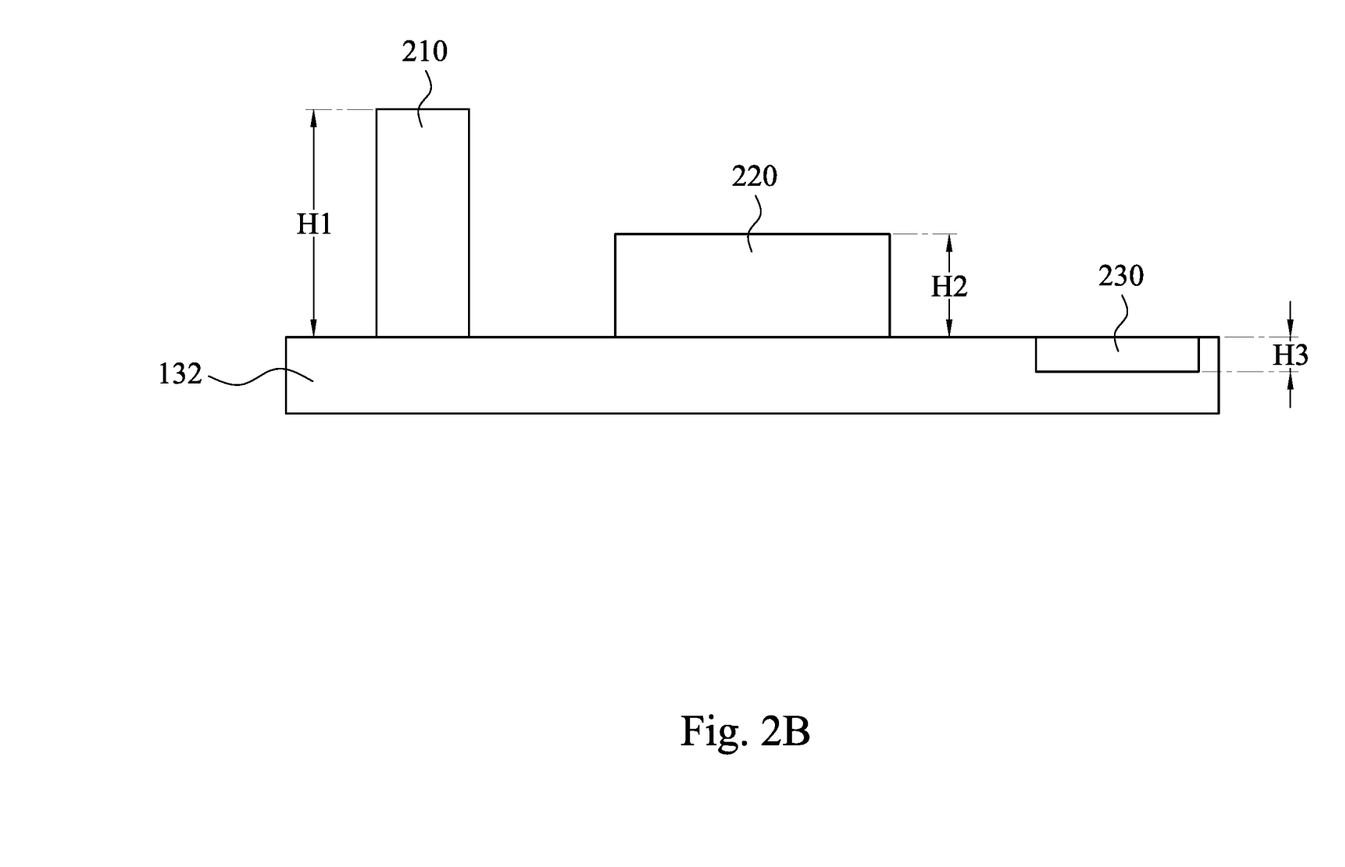

Reference is made to FIGS. 2A and 2B, which are schematic side view and top view of different patterns of a field on the wafer of and embodiments of the disclosure. The wafer 132 further includes a layer of photosensitive material to be exposed using the lithography apparatus 100. The photosensitive material may include a photoresist such as a chemical amplification resist (CAR). The wafer 132 includes multiple die regions (e.g., regions including integrated circuit devices). The wafer 132 also includes a plurality of exposure fields. An exposure field includes an area of the wafer 132 that is irradiated in a single exposure by the lithography apparatus. An exposure field may comprise one or more die regions and/or portions thereof.

The field 200 of the wafer 132 may include features having various heights, such as a first feature 210 having a first height H1, a second feature 220 having a second height H2, and a third feature 230 having a third height H3. In some embodiments, the first feature 210, the second feature 220, and the third feature 230 are formed on one or more layers of the wafer. The first feature 210 and the second feature 220 are protruded from the wafer 132, the first height H1 and the second height H2 are positive heights, and the first height H1 is greater than the second height H2. The third feature 230 is recessed from, for example, the top surface of the photoresist layer on the wafer 132, and thus the third height H3 is a negative height.

Various heights H1, H2, H3 of the features 210, 220, 230 negatively impact the depth-of-focus (DOF). A poor DOF provides for decreased resolution in the lithography process. Unlike the conventional exposure apparatus, in which the exposure process is executed at a fixed focus length for a given exposure field, the project lens 140 (see FIG. 1) of the lithography apparatus 100 (see FIG. 1) of the present disclosure is adjustable and is capable of providing multiple focus lengths in a shot.

Figure 3:
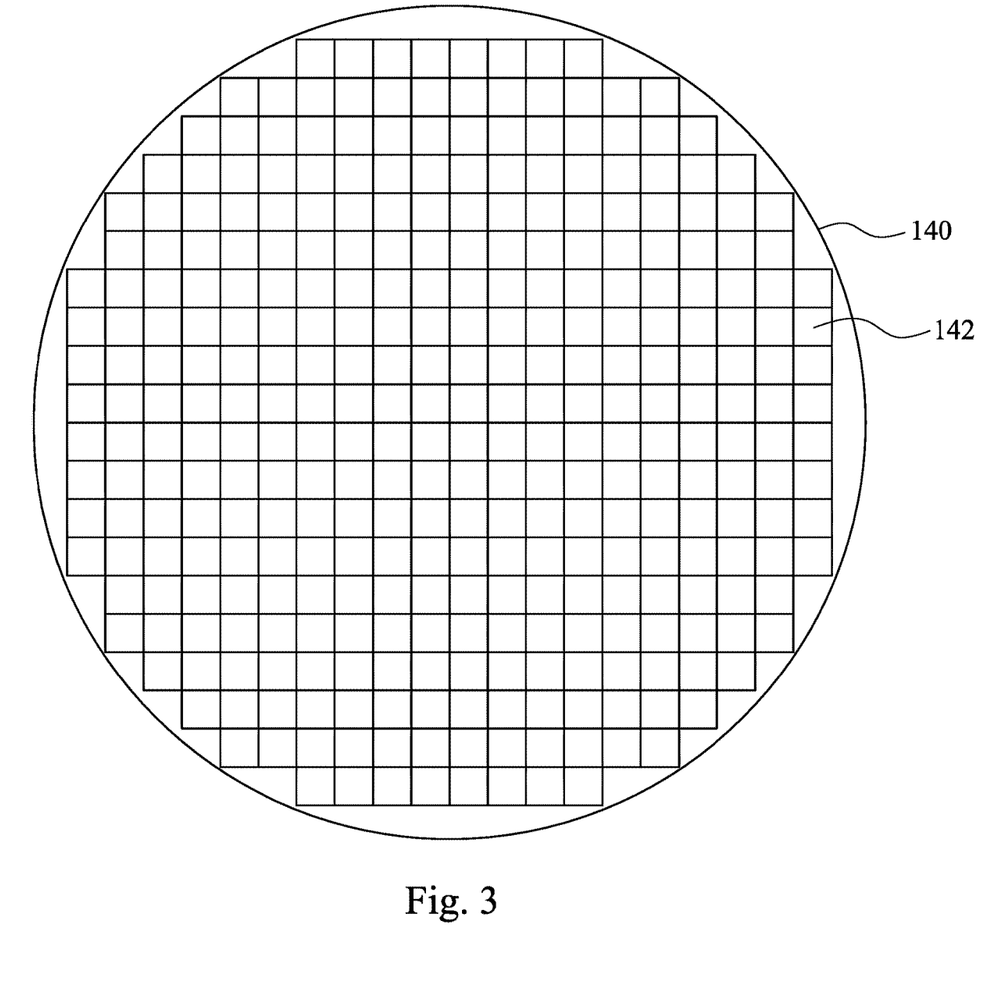
FIG. 3 is a schematic top view of a project lens according to some embodiments of the disclosure.

Reference is made to FIG. 3. FIG. 3 is a schematic top view of a project lens 140 according to some embodiments of the disclosure. The project lens 140 includes a plurality of project pixels 142, and each of project pixels 142 is a variable focusing area. Each of the variable focusing project pixels 142 provides for adjusting of the focus lengths of different regions of the project lens 140 according to the requirement of the profile of the wafer in the field. In some embodiments, project lens 140 provides for a plurality of focus lengths to be used to expose the wafer. In some embodiments, the project lens 140 provides for a plurality of focus lengths to be used to expose a single exposure field on the wafer. In some embodiments, the sizes and the focus lengths of the project pixels 142 are determined according to the profile of the wafer in the field and according to the patterns provided by the reticle.

Figure 4:
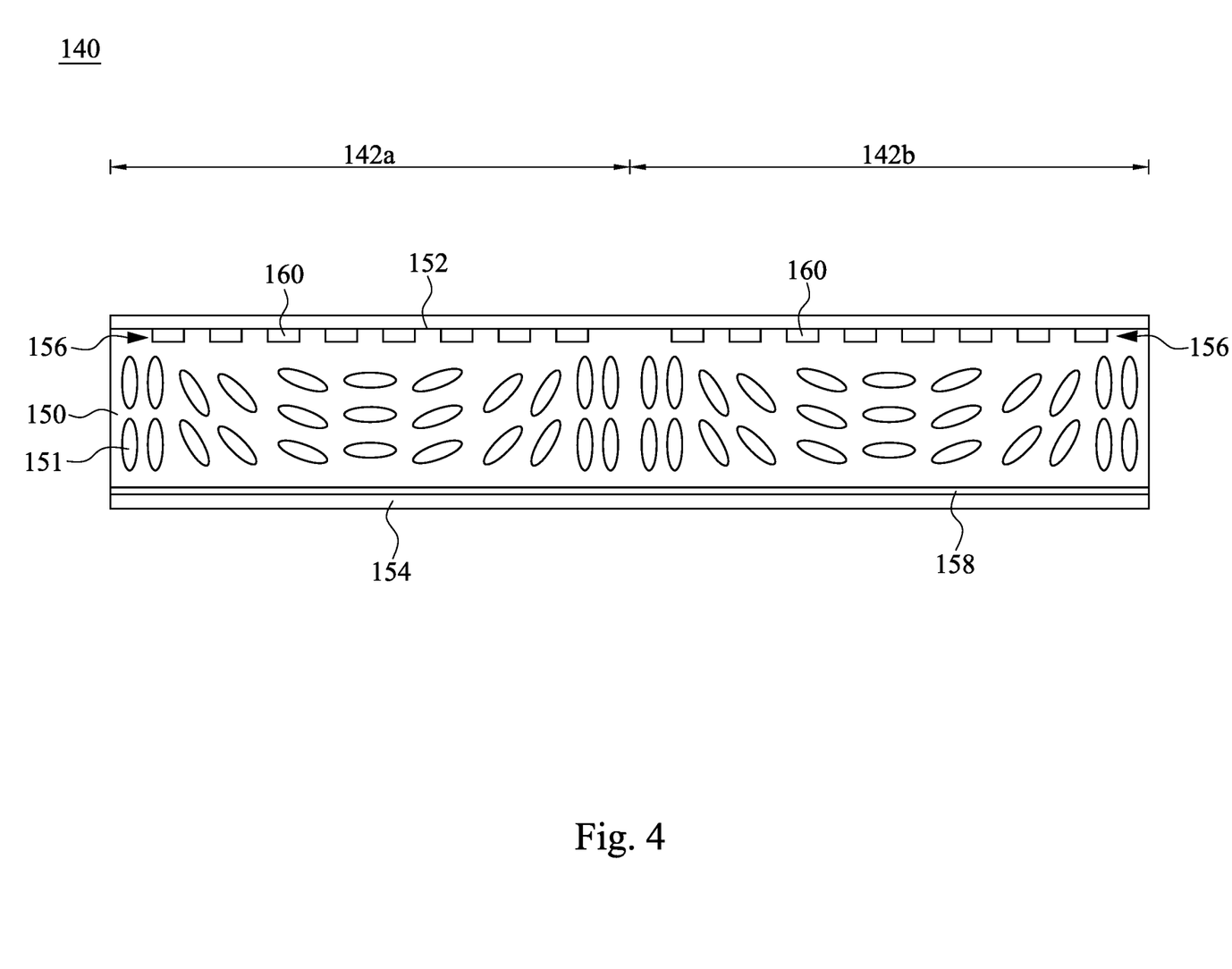
FIG. 4 is a cross-sectional view of the project lens according to some embodiments of the disclosure.

Reference is made to FIG. 4. FIG. 4 is a cross-sectional view of the project lens according to some embodiments of the disclosure. The project lens 140 includes plural project pixels, such as project pixels 142a and 142b. Although two project pixels 142a and 142b are illustrated in FIG. 4, more project pixels can be included in the project lens 140. The project lens 140 includes a first substrate 152, a second substrate 154, a liquid crystal layer 150, a plurality of electrode units 156, and a common electrode 158. The first substrate 152 and the second substrate 154 are disposed opposite to each other. The liquid crystal layer 150 is disposed between the first substrate 152 and the second substrate 154. The first substrate 152 and second substrate 154 are transparent substrates. The electrode units 156 are disposed on the first substrate 152 and beneath the liquid crystal layer 150. Each of the electrode units 156 includes a plurality of electrodes 160 formed on the first substrate 152. In some embodiments, the electrodes 160 of each of the project pixels 142a and 142b have substantially the same arrangement. That is, the electrodes 160 of the project pixel 142a may have the same size, same material, same thickness, and same intervals therebetween as the electrodes 160 of the project pixel 142b. However, the area of the project pixel 142a, e.g. the number of the electrodes 160 of the project pixel 142a, can be the same or different from that of the project pixel 142b, depending on the profile of the wafer and the patterns on the reticle.

The common electrode 158 is disposed between the second substrate 154 and the liquid crystal layer 150 and disposed on the second substrate 154. The electrode units 156 and the common electrode 158 include transparent electrodes such as Indium Tin Oxide (ITO). The voltages applied to each of the electrodes 160 of the electrode units 156 are adjustable, such that the electric field between the common electrode 158 and each of the electrode units 156 causes the liquid crystal molecules 151 to rotate and orient themselves along the direction of the field, and thus a liquid crystal lens is formed in the liquid crystal layer 150 corresponding to each of the electrode units 156.

Figure 5:
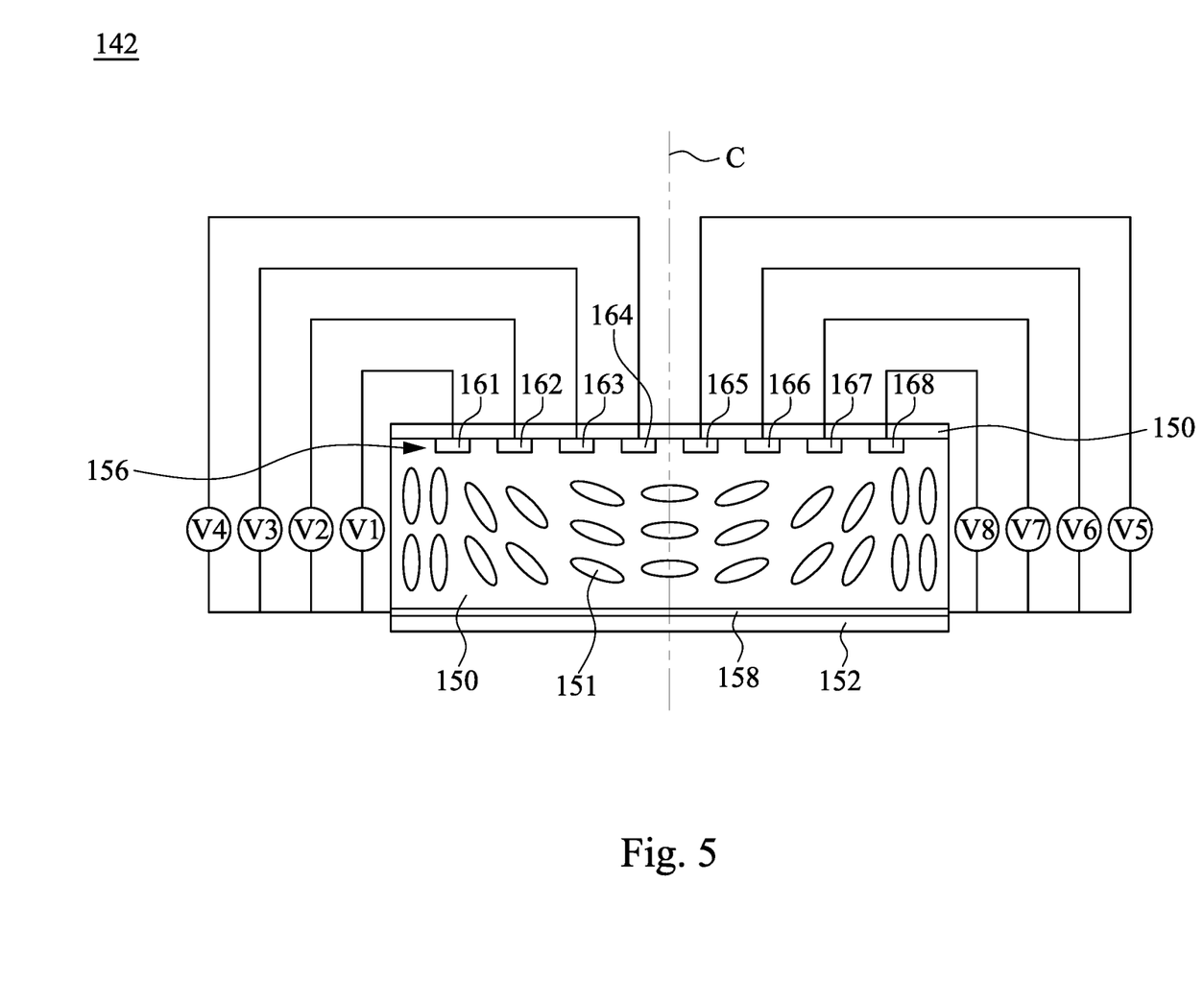
FIG. 5 is a cross-sectional view of a project pixel of the lens according to some embodiments of the disclosure.
Figure 6:
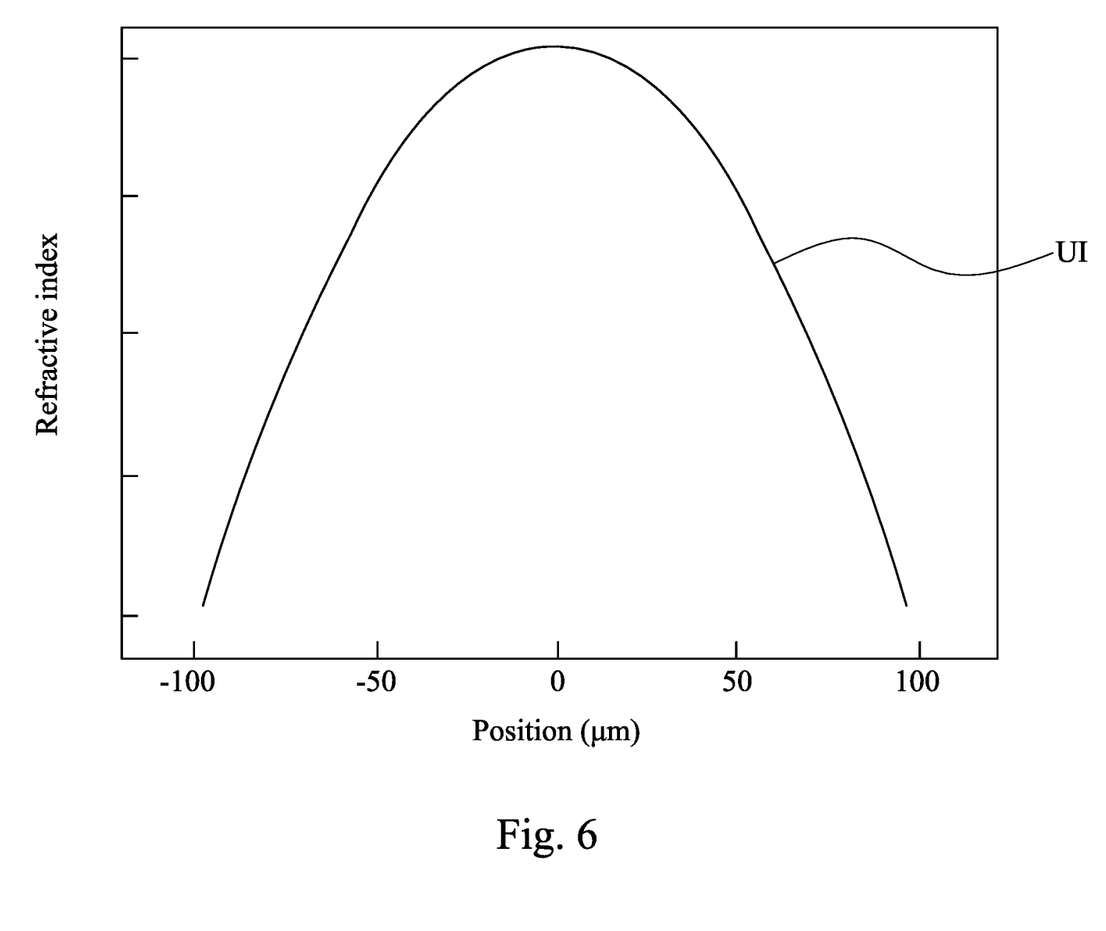
FIG. 6 is a schematic diagram of the refractive index of an ideal lens versus the position in the project pixel of FIG. 5.

Reference is made to FIG. 5 and FIG. 6. FIG. 5 is a cross-sectional view of a project pixel of the lens according to some embodiments of the disclosure. FIG. 6 is a schematic diagram of the refractive index of an ideal lens versus the position in the project pixel of FIG. 5. To provide a better understanding of the structure of the project lens, the following illustration and descriptions will only focus on a single project pixel 142, but not limited thereto. All of the project pixels 142 of the project lens can be individually controlled to tune the voltages of each of the electrodes 160 of individual project pixel 142. As shown in FIGS. 5-6, the first curve U1 presents information about a relation between the refractive index of an ideal lens and the position in an electrode unit 156 of the project pixel 142. The electrode unit 156, in this embodiment, includes a first electrode 161, a second electrode 162, a third electrode 163, a fourth electrode 164, a fifth electrode 165, a sixth electrode 166, a seventh electrode 167, and an eighth electrode 168 arranged in sequence. The first electrode 161, second electrode 162, third electrode 163, fourth electrode 164, fifth electrode 165, sixth electrode 166, seventh electrode 167, and eighth electrode 168 have substantially the same width and thickness. The first electrode 161, second electrode 162, third electrode 163, fourth electrode 164, fifth electrode 165, sixth electrode 166, seventh electrode 167, and eighth electrode 168 are equally spaced apart by intervals.

The first electrode 161 is electrically connected to the first voltage source V1. The second electrode 162 is electrically connected to the second voltage source V2. The third electrode 163 is electrically connected to the third voltage source V3. The fourth electrode 164 is electrically connected to the fourth voltage source V4. The fifth electrode 165 is electrically connected to the fifth voltage source V5. The sixth electrode 166 is electrically connected to the sixth voltage source V6. The seventh electrode 167 is electrically connected to the seventh voltage source V7. The eighth electrode 168 is electrically connected the eighth voltage source V8. In the project pixel 142, the first voltage source V1, the second voltage source V2, the third voltage source V3, the fourth voltage source V4, the fifth voltage source V5, the sixth voltage source V6, the seventh voltage source V7, and the eight voltage source V8 can be controlled individually thereby changing the electric fields between the common electrode 158 and the first electrode 161, second electrode 162, third electrode 163, fourth electrode 164, fifth electrode 165, sixth electrode 166, seventh electrode 167, and eighth electrode 168, respectively. Changing of the electric fields causes the liquid crystal molecules 151 to rotate and orient themselves along the directions of the fields. This leads to a variation in the refractive index profile through the electrode unit 160.

In this embodiment, the biases of the fourth voltage source V4 and the fifth voltage source V5 applied to the fourth electrode 164 and the fifth electrode 165 are substantially the same. The biases of the third voltage source V3 and the sixth voltage source V6 applied to the third electrode 163 and the sixth electrode 166 are substantially the same. The biases of the second voltage source V2 and the seventh voltage source V7 applied to the second electrode 162 and the seventh electrode 167 are substantially the same. The biases of the first voltage source V1 and the eighth voltage source V8 applied to the first electrode 161 and the eighth electrode 168 are substantially the same. Therefore, the electric fields between the common electrode 158 and the first electrode 161, second electrode 162, third electrode 163, fourth electrode 164, fifth electrode 165, sixth electrode 166, seventh electrode 167, and eighth electrode 168 and the orientation of the liquid crystal molecules 151 are symmetric with respect to the center axis C of the project pixel 142. Thus the refractive index of the liquid crystal molecules 151 to the position of the project pixel 142 is also symmetric.

The curve U1 illustrated in FIG. 6 presents the relation between the refractive index and the position in one project pixel 142. By tuning the biases of the first to eighth voltage sources V1-V8 applied to the first to eighth electrodes 161-168, the curve of the relation between the refractive index and the position in one project pixel is also adjustable. The lens effect of the liquid crystal lenticular lens of this embodiment is similar to the lens effect of an ideal lens, and therefore the project lens 140 of this embodiment can offer an adjustable focus effectively.

Figure 7:
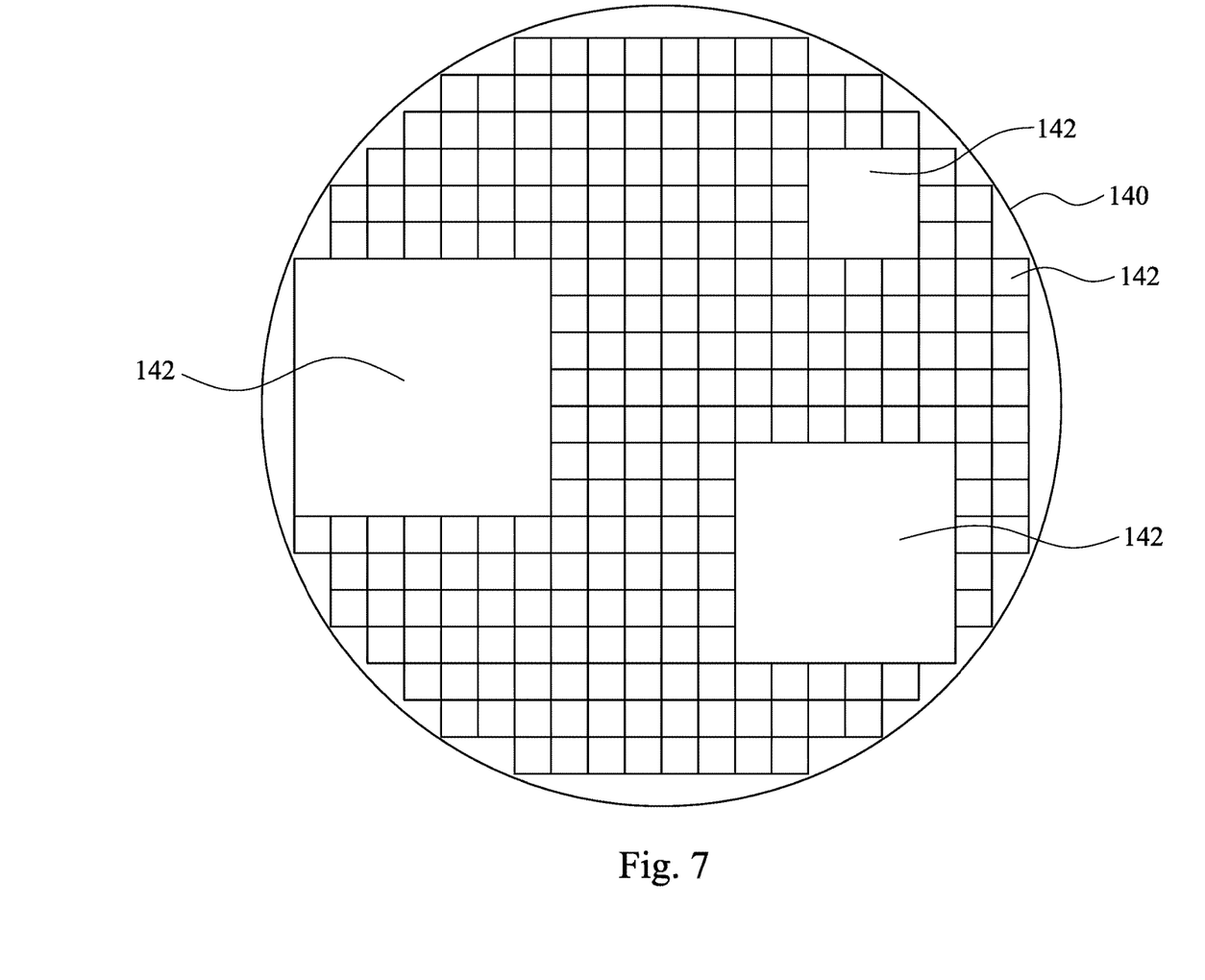
FIG. 7 is a schematic top view of the project lens according to some embodiments of the disclosure.

Reference is made to FIG. 7, which is a schematic top view of the project lens according to some embodiments of the disclosure. The project lens 140 includes a plurality of project pixels 142. Each of the project pixels 142 includes a plurality of electrodes respectively connected to different voltage sources, such that the electrical fields in a single project pixel 142 are adjustable, thereby tuning the rotation of the liquid crystal molecules to simulate an ideal lens having a desired focus length. In some embodiments, as shown in FIG. 3, the projects pixels 142 are in a regular arrangement, in which the shapes of the project pixels 142, the sizes of the project pixels 142, the number of the electrodes within the project pixels 142, and the gaps between the project pixels 142 are same, but the focus length provided by the individual project pixel 142 is adjustable. In some embodiments, as shown in FIG. 7, the arrangement of the projects pixels 142 can be determined based on the pattern of the reticle and the profile of the substrate and may not be regularly arranged. For example, the shapes of the project pixels 142, the sizes of the project pixels 142, the number of the electrodes within the project pixels 142 can be varied among the project pixels 142.

Further, the shapes of the project pixels 142, the sizes of the project pixels 142, the number of the electrodes within the project pixels 142 can be defined in one exposure process using a first reticle. Then the shapes of the project pixels 142, the sizes of the project pixels 142, the number of the electrodes within the project pixels 142 can be defined again in another one exposure process using a second reticle.

Figure 8:
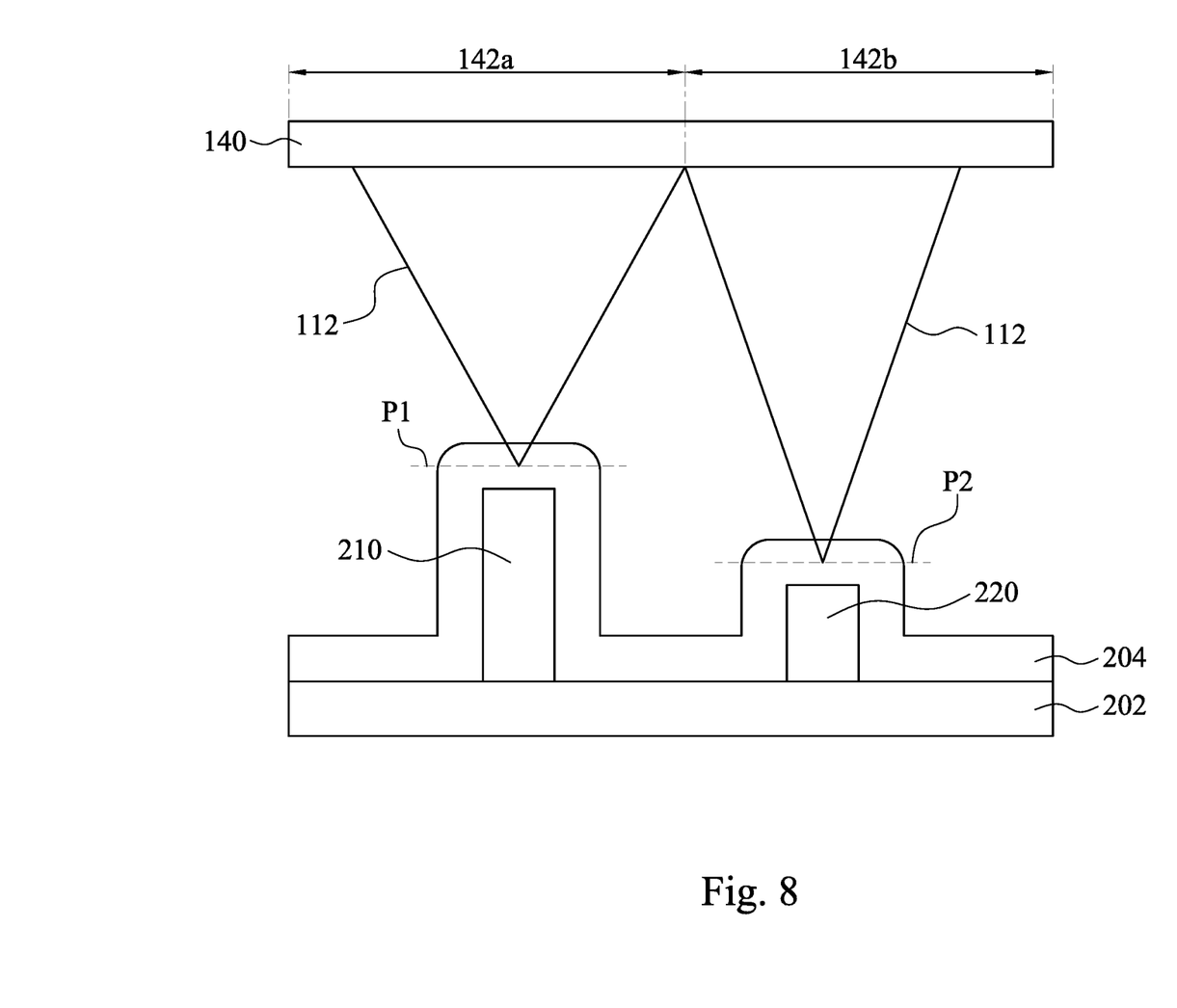
FIG. 8 is a schematic view of an exposure process according to some embodiments of the disclosure.

Reference is made to FIG. 8, which is a schematic view of an exposure process according to some embodiments of the disclosure. The exposure process is performed using the focus lens 140 as described previously. The project lens 140 includes plural project pixels, such as project pixels 142a and 142b. Although two project pixels 142a and 142b are illustrated in FIG. 8, more project pixels can be included in the project lens 140. The project lens 140 is utilized to expose one field 200 of the wafer. The wafer includes a substrate 202, a first feature 210 on the substrate 202, a second feature 220 on the substrate 202, and a photoresist layer 204 on the first feature 210, the second feature 220, and the substrate 202. The first feature 210 and the second feature 220 have different heights thus the DOFs thereof are different. The focus lengths of the project pixels 142a and 142b can be adjusted according to the desired depth of focus, such that the beams 112 can focus on different planes P1 and P2 after passing through the project pixels 142a and 142b.

Figure 9:
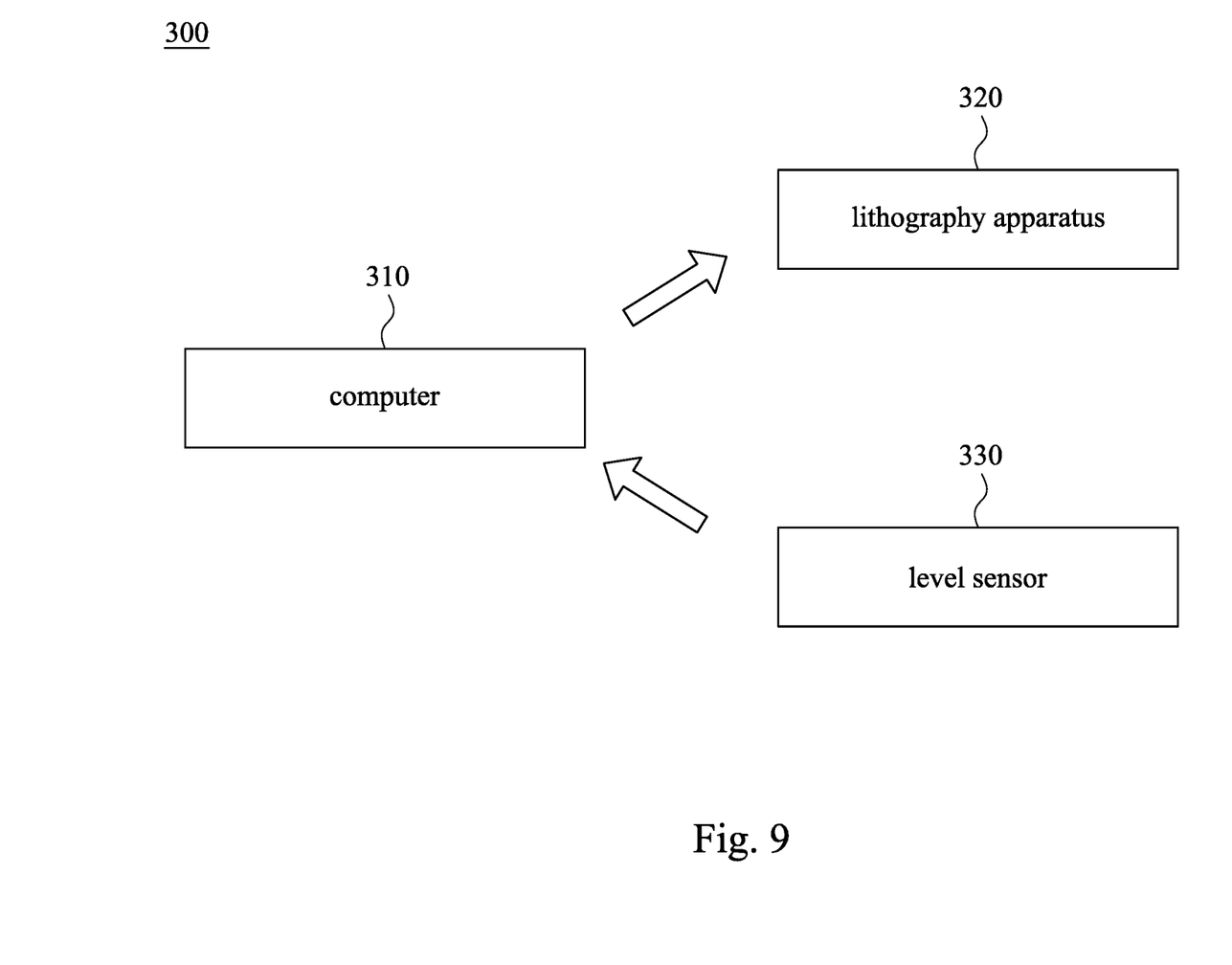
FIG. 9 is a block diagram of an exposure process system according to some embodiments of the disclosure.

Reference is made to FIG. 9. FIG. 9 is a block diagram of an exposure process system 300 according to some embodiments of the disclosure. The exposure process system 300 may be used to provide process control to improve an exposure quality. In some embodiments, exposure process system 300 allows multiple focus lengths to be adjusted locally to compensate for topology differences on the target area (e.g., the exposure field) of the substrate. The exposure process system 300 includes a computer 310, a lithography apparatus 320, and level sensor 330. Arrows in FIG. 9 illustrates information flow. Though illustrated as distinct units, the level sensor 330 may be included in the lithography apparatus 320. Likewise, the computer 310 may be software and/or hardware included in the lithography apparatus 320 and/or the level sensor 330. The lithography apparatus 320 may be substantially similar to the lithography apparatus 100, described in detail above with reference to FIG. 1.

The level sensor 330 is operably coupled to the computer 310 such that information may be transferred between the level sensor 330 and the computer 310. A determination of plurality of levels for the wafer provides a level sensor map (e.g., a denotation of a relative height of a wafer at two or more locations on the wafer). The information transferred may include one or more determinations of a topology of a substrate (e.g., a level sensor map). The level sensor map may include a level (e.g., a height in relation to a plane) of one or more points on a substrate. In some embodiments, a level sensor map may include a plurality of levels each corresponding to a point on a single exposure field of a substrate.

The computer 310 is an information handling system which is capable of processing, executing, or otherwise handling information. The computer 310 includes computer readable medium to store functional descriptive material (e.g., software or data structures). Such functional descriptive material imparts functionality when encoded on the computer readable medium. The computer 310 may also include a processor for processing and otherwise manipulating received and/or stored data. The computer 310 may include a controller having functionality such as described above with reference to the controller of the project lens 140 as described above.

In some embodiments, the computer 310 receives a level sensor map and provides a DOF distribution map according to the level sensor map. For example, the DOF distribution map specifies a first focus length to be applied to expose a first area of the wafer and a second focus length to be applied to expose a second area of the wafer, in which the first area and the second area of the wafer are within a single exposure field. In some embodiments, the DOF distribution map further provides a distribution of strengths of electric fields to apply to the project lens included in the lithography apparatus 320 corresponding to the desired focus lengths for the locations in the exposure field. The project lens may be substantially similar to the project lens 140 described above. The computer 310 may include, or be operably coupled to, a controller operable to apply determined electric fields (e.g., supplying various voltages), such as provided by the DOF distribution map, to the project lens.

Figure 10:
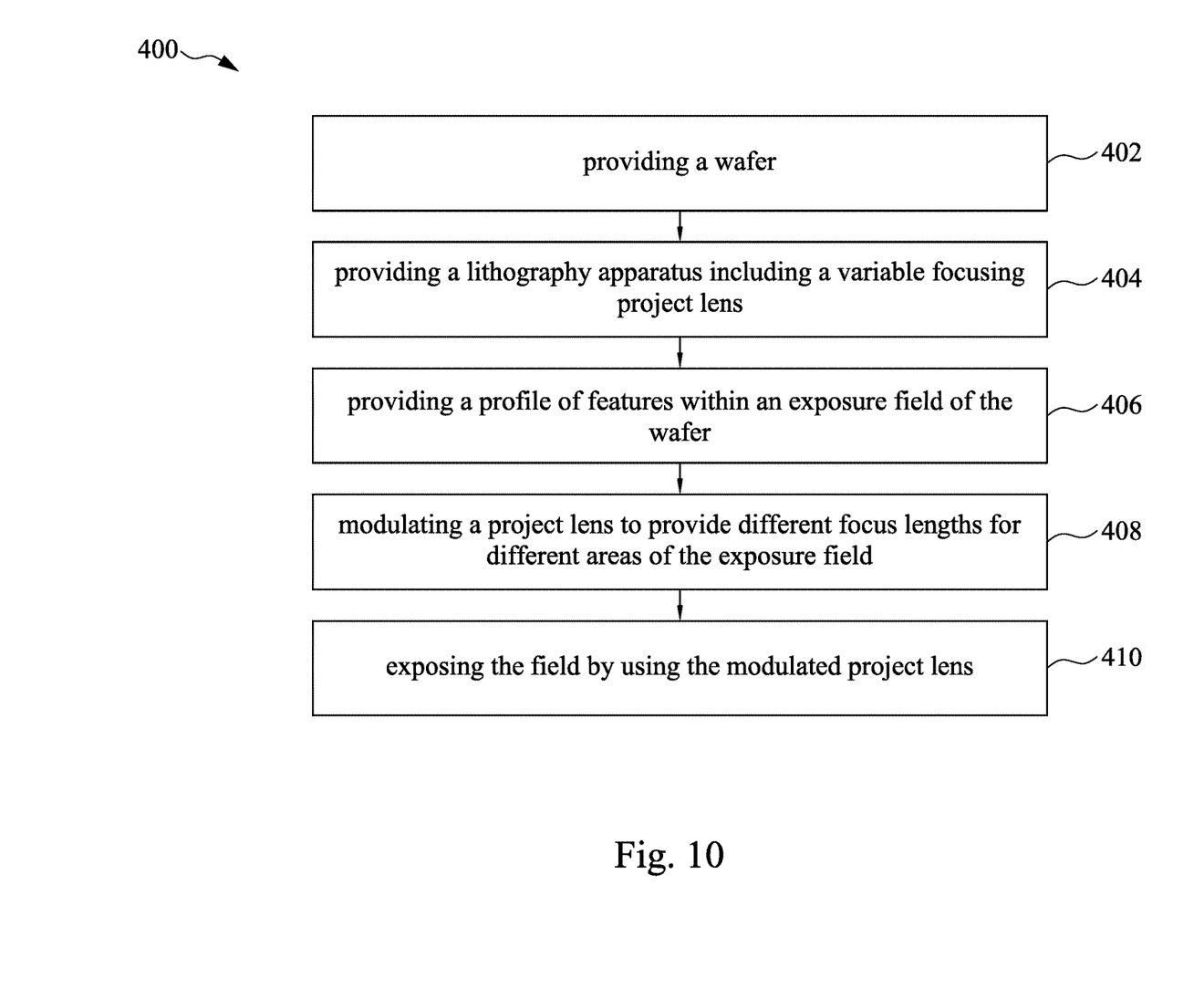
FIG. 10 is a flowchart of method of performing a lithography process according to some embodiments of the disclosure.

Reference is made to FIG. 10, which is a flowchart of method of performing a lithography process according to some embodiments of the disclosure. The method 400 includes an exposure process employed in a lithography process. The method 400 begins at step 402 where a wafer including a substrate coated with at least one layer of photosensitive material is provided. The photosensitive material (e.g., photoresist) present on the substrate may be formed using a spin-on process, a deposition process, and/or formed by the other processes known in the art. The photoresist may include positive-type or negative-type photoresist. One or more layers and/or features may be present on the substrate in addition to the photoresist layer, including underlying the photoresist layer. After forming the photoresist layer, the wafer may be baked in preparation for the exposure process.

The method 400 then proceeds to step 404 where a lithography apparatus including a variable focusing project lens is provided. The lithography apparatus provided may be substantially similar to the lithography apparatus described above. The variable focusing project lens may be substantially similar to the project lens 140 described above. The lithography apparatus may include a wafer stage on which the wafer, provided above in reference to step 402, is placed.

The method 400 then proceeds to step 406 where a level sensor map including a determination of a profile of the features within an exposure field. The level sensor map may be generated by a level sensor such as the level sensor 330 described above with reference to FIG. 9.

The method 400 then proceeds to step 408 where the variable focusing project lens is modulated to provide appropriate focus lengths for different areas of the exposure field of the exposure process. The required adjustments to the focus lengths are determined using the level sensor map, described above with reference to step 406. The variable focusing project lens may be modulated by adjusting the electric fields of respectively project pixels such that the orientations of the liquid crystal molecules can be controlled to simulate plural ideal lenses within one variable focusing project lens.

The method 400 then proceeds to step 410 where the field is exposed on the wafer by using the variable focusing project lens. The areas in the exposure field are the same as the project pixels in the variable focusing device. In some embodiments, the focus lengths of the radiation beam incident on the wafer are defined in part by the variable focusing project lens. The variable focusing project lens provides different focus lengths within a single exposure field of a shot for a given wafer.

Figure 11:
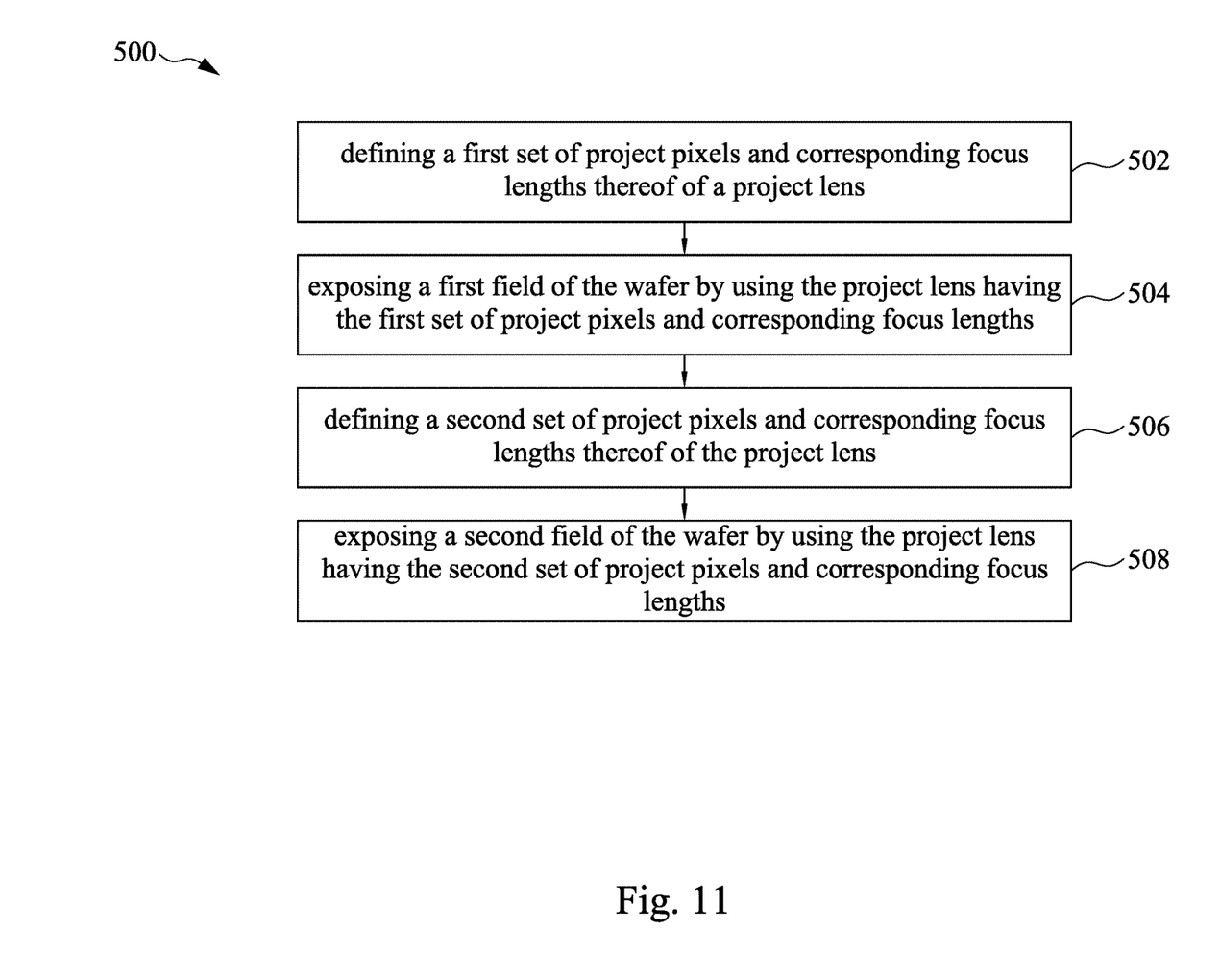
FIG. 11 is a flowchart of method of performing a lithography process according to some embodiments of the disclosure.

Reference is made to FIG. 11, which is a flowchart of method of performing a lithography process according to some embodiments of the disclosure. The method 500 begins at step 502, in which a first set of project pixels and corresponding focus lengths thereof of a variable focusing project lens are defined according to a first pattern of a first reticle and a first profile of a first field. The first profile of the first field includes several features having different heights. The variable focusing project lens includes a liquid crystal layer sandwiched between electrodes, and the voltages applied to the electrodes are adjusted individually such that the electric fields of different project pixels can be tuned to provide different focus lengths.

The method 500 then proceeds to step 504, a first exposure process is performed to expose the first field of the wafer. The first exposure process is performed by using the first reticle having the first pattern and the variable focusing project lens as set in previous step 502. The variable focusing project lens includes plural project pixels that respectively provide different focus lengths. Therefore, beams pass through the variable focusing project lens and focus on different planes of the features in the first exposure field.

After the first exposure process for exposing the first field is completed. The method 500 then goes to step 506, in which a second set of project pixels and corresponding focus lengths thereof of the variable focusing project lens are defined according to a second pattern of a second reticle and a second profile of a second field. The second profile of the second field also includes several features having different heights. The voltages applied to the electrodes of the variable focusing project lens are again adjusted individually such that the electric fields of different project pixels can be tuned to provide different focus lengths. In some embodiment, the electric fields can be erased by stopping applying voltages to the electrodes, before setting the second set of project pixels.

The method 500 then proceeds to step 508, a second exposure process is performed to expose the second field of the wafer. The second exposure process is performed by using the second reticle having the second pattern and the variable focusing project lens as set in previous step 506. The variable focusing project lens includes plural project pixels that respectively provide different focus lengths. Therefore, beams pass through the variable focusing project lens and focus on different planes of the features in the first exposure field.

The focus lengths of the variable focusing project lens provided to exposure one exposure field can be adjusted according to the pattern of the reticle and the profile wafer, by tuning the voltages applied to the electrode units of the project pixels. The range and the number of DOFs provided by the variable focusing project lens is broadened and thus increasing the performance of the lithography apparatus.

According to some embodiments of the disclosure, a method of lithography includes obtaining a profile of a single field of a substrate that having a photoresist layer thereon, in which the profile includes a first feature and a second feature having different heights. A depth of focus distribution map is generated according to the profile. A project lens is tuned based on the generated depth of focus distribution map, such that the project lens provides a first focus length in a first project pixel of the project lens and a second focus length in a second project pixel of the project lens, wherein the first focus length and the second focus lengths. The single field of the substrate is exposed by using the tuned project lens.

According to some embodiments of the disclosure, a method of lithography includes defining a first set of project pixels and corresponding focus lengths thereof of a project lens; performing a first exposure process to expose a first field of the wafer by using the defined project lens having the first set of project pixels and corresponding focus lengths; defining a second set of project pixels and corresponding focus lengths thereof of the project lens; and performing a second exposure process to expose a second field of the wafer by using the defined project lens having the second set of project pixels and corresponding focus lengths.

According to some embodiments of the disclosure, a lithography apparatus includes a wafer stage configured to support a wafer, a reticle disposed above the wafer stage, a light source configured to provide beam of radiation passing through the reticle, a project lens disposed between the reticle and the wafer stage, and a processor. The project lens includes a first project pixel providing a first focus length and a second project pixel providing a second focus length different from the first focus length. The processor is configured to provide a depth of focus distribution map for exposing a single field of the wafer and control the project lens according to the depth of focus distribution map.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of lithography, comprising:
    defining a first set of project pixels and corresponding focus lengths thereof of a project lens;
    performing a first exposure process to expose a first field of a wafer by using the project lens having the defined first set of project pixels and corresponding focus lengths;
    defining a second set of project pixels and corresponding focus lengths thereof of the project lens;
    performing a second exposure process to expose a second field of the wafer by using the project lens having the defined second set of project pixels and corresponding focus lengths, wherein the first exposure process and the second exposure process are performed concurrently; and maintaining a top surface and a bottom surface of the project lens in a fixed and flat configuration and rotating liquid crystal molecules between the top surface and the bottom surface of the project lens during the first exposure process and the second exposure process.

2. The method of claim 1, wherein defining the first set of project pixels and corresponding focus lengths comprises:
obtaining a profile of the first field of the wafer;
generating a depth of focus distribution map of the first field according to the profile; and
tuning electric fields of the first set of project pixels, individually.

3. The method of claim 2, wherein tuning the electric fields of the first set of project pixels comprises:
applying various voltage biases to a plurality of electrodes in each of the first set of project pixels, individually.

4. The method of claim 1, wherein the first set of project pixels and corresponding focus lengths thereof are defined according to a first pattern of a first reticle.

5. The method of claim 1, wherein defining the second set of project pixels and corresponding focus lengths comprises:
obtaining a profile of the second field of the wafer;
generating a depth of focus distribution map of the second field according to the profile; and
tuning electric fields of the second set of project pixels, individually.

6. The method of claim 5, wherein tuning the electric fields of the second set of project pixels comprises:
applying various voltage biases to a plurality of electrodes in each of the second set of project pixels, individually.

7. The method of claim 1, wherein the second set of project pixels and corresponding focus lengths thereof are defined according to a second pattern of a second reticle.

8. A lithography apparatus, comprising:
a wafer stage configured to support a wafer;
a reticle disposed above the wafer stage;
a light source configured to provide a beam of radiation passing through the reticle;
a project lens extending along a lengthwise direction and disposed between the reticle and the wafer stage, wherein the project lens comprises a first project pixel providing a first focus length and a second project pixel providing a second focus length different from the first focus length, and the project lens has a substantially permanently flat top surface and a substantially permanently flat bottom surface, and the first project pixel is next to the second project pixel along the lengthwise direction; and
a processor configured to provide a depth of focus distribution map for exposing a single field of the wafer and control the project lens according to the depth of focus distribution map.

9. The lithography apparatus of claim 8, wherein the project lens comprises:
a first substrate;
a plurality of electrodes on the first substrate;
a second substrate;
a common electrode on the second substrate; and
a liquid crystal layer between the first and second substrates.

10. The lithography apparatus of claim 9, further comprising a plurality of voltage source powers connected to the electrodes, respectively.

11. The lithography apparatus of claim 9, wherein the electrodes and the common electrode comprise a transparent conductive material.

12. The method of claim 1, wherein defining the first set of project pixels and corresponding focus lengths thereof of the project lens and defining the second set of project pixels and corresponding focus lengths thereof of the project lens are performed concurrently.

13. The method of claim 2, wherein tuning the electric fields of the first set of project pixels is such that the liquid crystal molecules rotate.

14. The method of claim 5, wherein tuning the electric fields of the second set of project pixels is such that the liquid crystal molecules rotate.

15. A lithography apparatus, comprising:
a wafer stage configured to support a wafer;
a reticle above the wafer stage;
a project lens between the reticle and the wafer stage and having liquid crystal molecules therein, wherein the project lens comprises a first project pixel and a second project pixel configured to respectively provide a first focus length and a second focus length different from the first focus length, and the liquid crystal molecules are configured to form the first focus length and the second focus length, the first and second project pixels comprise electrodes therein, and an interval between two adjacent electrodes of the first project pixel is substantially the same as an interval between two adjacent electrodes of the second project pixel; and
a light source configured to provide a first beam passing through the reticle and the project lens.

16. The lithography apparatus of claim 15, wherein the light source is configured to provide the first beam and a second beam respectively and concurrently passing through the first project pixel and the second project pixel of the project lens.

17. The lithography apparatus of claim 15, wherein the liquid crystal molecules in the first project pixel are symmetric with respect to a center axis of the first project pixel.

18. The lithography apparatus of claim 17, wherein the liquid crystal molecules in the second project pixel are symmetric with respect to a center axis of the second project pixel.

19. The method of claim 1, wherein rotating the liquid crystal molecules is performed such that orientation of the liquid crystal molecules are symmetric with respect to a center axis of one of the project pixels.

20. The method of claim 1, wherein rotating the liquid crystal molecules is performed such that refractive indexes of the liquid crystal molecules are symmetric with respect to a center axis of one of the project pixels.

* * * * *